United States Patent
Feng et al.

(10) Patent No.: US 9,658,260 B2
(45) Date of Patent: May 23, 2017

(54) POWER SYSTEM STATE ESTIMATION USING A TWO-LEVEL SOLUTION

(71) Applicant: ABB Technology AG, Zurich (CH)

(72) Inventors: Xiaoming Feng, Cary, NC (US); Vaibhav Donde, Cary, NC (US); Ernst Scholtz, Houston, TX (US)

(73) Assignee: ABB SCHWEIZ AG, Baden (CH)

( * ) Notice: Subject to any disclaimer, the term of this patent is extended or adjusted under 35 U.S.C. 154(b) by 722 days.

(21) Appl. No.: 14/017,597

(22) Filed: Sep. 4, 2013

(65) Prior Publication Data

US 2015/0066402 A1    Mar. 5, 2015

(51) Int. Cl.
  *G01R 21/00* (2006.01)
  *G01R 19/25* (2006.01)
  *H02J 3/36* (2006.01)

(52) U.S. Cl.
  CPC ............ *G01R 19/2513* (2013.01); *H02J 3/36* (2013.01); *Y02E 60/60* (2013.01); *Y02E 60/74* (2013.01); *Y04S 10/30* (2013.01)

(58) Field of Classification Search
  CPC ........ G01R 19/2513; H02J 3/36; Y02E 60/74; Y02E 60/60; Y04S 10/30
  USPC ........... 702/60, 61; 700/286; 706/21, 12, 15, 706/31, 45
  See application file for complete search history.

(56) References Cited

U.S. PATENT DOCUMENTS

| | | | |
|---|---|---|---|
| 7,392,231 B2* | 6/2008 | Basak | ...................... G06N 3/08 706/31 |
| 7,912,461 B2* | 3/2011 | Wigren | ................ H04W 52/223 370/242 |
| 8,000,914 B2* | 8/2011 | Venkatasubramanian | .............. G01R 19/2513 702/59 |
| 2008/0254788 A1* | 10/2008 | Wigren | ................ H04W 52/223 455/423 |
| 2013/0226538 A1* | 8/2013 | Donde | .................... G06F 17/10 703/2 |
| 2013/0238149 A2* | 9/2013 | Yasni | ...................... F01K 13/02 700/286 |

(Continued)

OTHER PUBLICATIONS

De La Villa Jaén, A. et al. "Voltage Source Converter Modeling for Power System State Estimation: STATCOM and VSC-HVDC." IEEE Transactions on Power Systems, Nov. 2008, pp. 1552-1559, vol. 23, Issue No. 4.

(Continued)

*Primary Examiner* — Carol S Tsai
(74) *Attorney, Agent, or Firm* — Taft Stettinius & Hollister LLP

(57) ABSTRACT

A power system grid is decomposed into several parts and decomposed state estimation steps are executed separately, on each part, using coordinated feedback regarding a boundary state. The achieved solution is the same that would be achieved with a simultaneous state estimation approach. With the disclosed approach, the state estimation problem can be distributed among decomposed estimation operations for each subsystem and a coordinating operation that yields the complete state estimate. The approach is particularly suited for estimating the state of power systems that are naturally decomposed into separate subsystems, such as separate AC and HVDC systems, and/or into separate transmission and distribution systems.

19 Claims, 6 Drawing Sheets

(56) References Cited

U.S. PATENT DOCUMENTS

2014/0112164 A1* 4/2014 Wigren ............... H04W 24/08
370/252
2014/0244189 A1* 8/2014 Chiang ............. G01R 19/2513
702/61

OTHER PUBLICATIONS

Roy, L. et al. "Static State Estimation of Multiterminal DC/AC Power System in Rectangular Co-Ordinates." Electric Power Components and Systems, Oct. 2005, pp. 69-80, vol. 33, Issue No. 10, Taylor & Francis, London, United Kingdom.

Jegatheesan R. et al. "AC/Multiterminal DC Power System State Estimation—A Sequential Approach." Electric Power Components and Systems, Oct. 2005, pp. 27-42, vol. 33, Issue No. 10, Taylor & Francis, London, United Kingdom.

Sirisena, H.R. et al. "Inclusion of HVDC Links in AC Power-System State Estimation." IEE Proceedings C Generation, Transmission and Distribution, Nov. 11, 2008, pp. 147-154, vol. 128, Issue No. 3.

Sinha, A.K. et al. "A Decoupled Second Order State Estimator for AC-DC Power Systems." IEEE Transactions on Power Systems, Aug. 1994, pp. 1485-1493, vol. 9, Issue No. 3.

Ding, Q. et al. "An Improved Sequential Method for AC/MTDC Power System State Estimation." IEEE Transactions on Power Systems, Aug. 2001, pp. 506-512, vol. 16, Issue No. 3.

Leite De Silva, A.M. et al. "State Estimation for Integrated Multi-Terminal DC/AC Systems." IEEE Transactions on Power Apparatus and Systems, Sep. 1985, pp. 2349-2355, vol. PAS-104, Issue No. 9.

Glover, J.D. et al. "State Estimation of Interconnected HVDC / AC Systems." IEEE Transactions on Power Apparatus and Systems, Jun. 1983, pp. 1805-1810, vol. PAS-102, Issue No. 6.

Aguado, J.A. et al. "Decentralised Power System State Estimation: A Decomposition-Coordination Approach." Paper Accepted for Presentation at 2001 IEEE Porto Power Tech Conference, Sep. 10-13, 2001, pp. 1-6, Porto, Portugal.

Carvalho, J.B. et al. "Distributed Processing in Power System State Estimation." 10th Mediterranean Electrotechnical Conference, May 29-31, 2000, pp. 1128-1131, vol. 3.

Ebrahimian, R. et al. "State Estimation Distributed Processing." IEEE Transactions on Power Systems, Nov. 2000, pp. 1240-1246, vol. 15, Issue No. 4.

Jiang, W. et al. "A Distributed State Estimator Utilizing Synchronized Phasor Measurements." IEEE Transactions on Power Systems, May 2007, pp. 563-571, vol. 22, Issue No. 2.

Gamm, A.Z. et al. "Decomposition Algorithm for Power System State Estimation by the Test Equation Technique and its Implementation on the Basis of Multi-Agent Approach." Paper Accepted for Presentation at 2009 IEEE Bucharest Power Tech Conference, Jun. 28-Jul. 2, 2009, pp. 1-7, Bucharest, Romania.

Korres, G.N. "A Distributed Multiarea State Estimation." IEEE Transactions on Power Systems, Feb. 2011, pp. 73-84, vol. 26, Issue No. 1.

Yang, T. et al. "Transition to a Two-Level Linear State Estimator—Part II: Algorithm." IEEE Transactions on Power Systems, Feb. 2011, pp. 54-62, vol. 26, Issue No. 1.

* cited by examiner

POWER SYSTEM STATE ESTIMATION USING A TWO-LEVEL SOLUTION

TECHNICAL FIELD

The present disclosure relates to state estimation of an electrical power grid, and more particularly relates to a two-level approach facilitating the coordinated state estimation of decomposed portions of a power grid.

BACKGROUND

Power system state estimation is an important prerequisite function for the intelligent management of a power grid. Two types of state estimators, namely, static and dynamic are possible for realization. Traditionally, static state estimation techniques are used by the electric power industry to estimate the state (typically the magnitudes and angles of the bus voltage phasors) of power transmission and distribution systems, due to the techniques' relative simplicity and the ready availability of supervisory control and data acquisition (SCADA) data that is often obtained at relatively slow sampling rates. Dynamic state estimation, on the other hand, would allow power system operators to observe and respond to transient state changes in the power system, and is likely to become more relevant with the increasing availability of fast-sampled sensor data, such as phasor measurement unit (PMU) data.

State estimation is typically executed on the entire power grid, under the jurisdiction of the governing and/or monitoring entity, e.g., an independent system operator (ISO) or utility, while considering all the components and their interactions in the grid at once. However, several changes in the power industry are resulting in systems where a single governing and/or monitoring entity may no longer have immediate access to measurements across the entire grid. For instance, in some cases operational control of transmission grids is performed by an entity other than the generating/distributing utilities. These changes, coupled with the rapidly increasing complexity of power systems, create challenges for power system state estimation. Accordingly, improved techniques for power system state estimation are needed.

SUMMARY

According to several embodiments of the techniques detailed herein, a power system grid is decomposed into several parts and decomposed state estimation steps are executed separately, on each part, using coordinated feedback regarding a boundary state. The achieved solution is the same that would be achieved with a simultaneous state estimation approach. However, with this approach, the state estimation problem can be distributed among decomposed estimation operations for each subsystem and a coordinating operation that yields the complete state estimate. The approach is particularly suited for estimating the state of power systems that are naturally decomposed into separate subsystems, such as separate AC and HVDC systems, and/or into separate transmission and distribution systems.

An example method according to the disclosed techniques is for state estimation in a power system that comprises a first subsystem having a corresponding first state vector and corresponding first measurements for a first state estimation time, a second subsystem having a corresponding second state vector and corresponding second measurements for the first state estimation time, and a boundary connecting the first and subsystems and having a boundary state vector for the first state estimation time. The method begins with, for a first iteration, setting a working estimate of the boundary state vector to equal an initial estimate. For the first iteration for one or more subsequent iterations, an estimate of the first state vector is calculated, based on the working estimate of the boundary state vector, the first measurements, and a first subsystem measurement function. An estimate of the second state vector is separately calculated, for each iteration, based on the working estimate of the boundary state vector, the second measurements, and a second subsystem measurement function.

First and second state estimate sensitivities are then calculated, for each iteration, the first and second state estimate sensitivities representing sensitivities of the estimates of the first and second state vectors to the initial estimate of the boundary state vectors, respectively. The working estimate of the boundary state vector is then revised, based on the first and second state estimate sensitivities. The calculating, computing, and revising operations are repeated, until a convergence criterion is met.

It will be appreciated that the subsystem state estimation operations may be carried out at distinct computing nodes, and are independent of one another except that they rely on the same working estimate of the boundary state vector. The working estimate of the boundary state vector may be managed by a control node, which may be separate from either or both of the nodes carrying out the subsystem state estimation operations. This control node, in some embodiments, receives the calculated state estimate sensitivities from each of the subsystem state estimation operations, and then revises the working estimate of the boundary state vector, which is then fed back to the nodes carrying out the subsystem state estimation operations, for use in subsequent iterations.

Thus, other embodiments of the invention include state estimation units for use in estimating the state of a power system that comprises a first subsystem having a corresponding first state vector and corresponding first measurements for a first state estimation time, a second subsystem having a corresponding second state vector and corresponding second measurements for the first state estimation time, and a boundary connecting the first and subsystems and having a boundary state vector for the first state estimation time. An example state estimation unit comprises at least one processing circuit configured to, for a first iteration, set a working estimate of the boundary state vector to equal an initial estimate. The at least one processing circuit is further configured to, or the first iteration and for one or more subsequent iterations, calculate an estimate of the first state vector, based on the working estimate of the boundary state vector, the first measurements, and a first subsystem measurement function. For each iteration, the at least one processing circuit separately calculates an estimate of the second state vector, based on the working estimate of the boundary state vector, the second measurements, and a second subsystem measurement function.

The at least one processing circuit is still further configured to compute first and second state estimate sensitivities, the first and second state estimate sensitivities representing sensitivities of the estimates of the first and second state vectors to the initial estimate of the boundary state vectors, respectively, and to revise the working estimate of the boundary state vector, based on the first and second state estimate sensitivities. The at least one processing circuit is configured to repeat these calculating, computing, and revising operations until a convergence criterion is met. It will be appreciated that the state estimation unit further comprises at least one memory configured to store the estimates of the first and second state vectors, the working estimate of the boundary state vector, and the first and second state estimate sensitivities.

Those skilled in the art will recognize variations of the above-summarized embodiments, as well as additional features and advantages of the disclosed techniques, upon reading the following detailed description and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1:
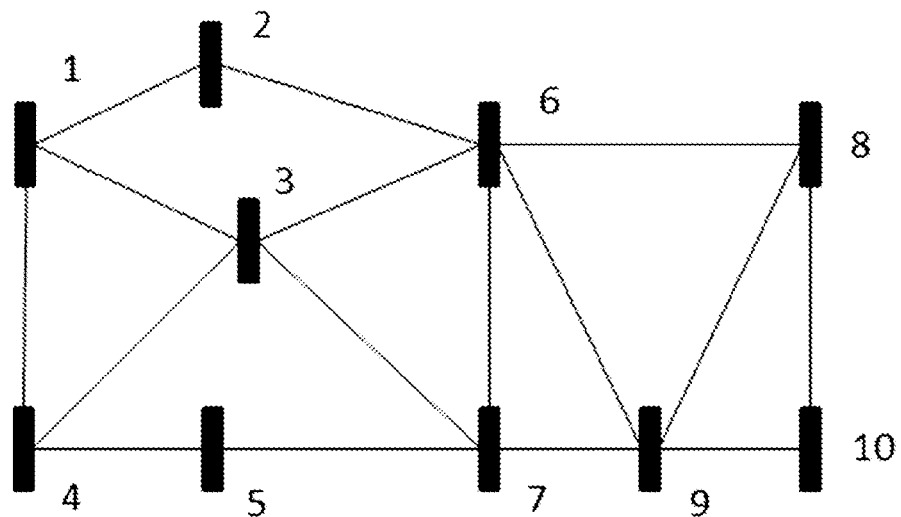
FIG. 1 illustrates an example power system before decomposition.

Described herein are techniques for power system state estimation whereby a power system is decomposed into several parts on which the state estimation is executed separately, in a coordinated way, such that the solution obtained is the same as that from the simultaneous solution. The techniques employ a general formulation of the state estimation problem that is applicable to solving the state estimation problem for a power grid.

It will be appreciated that one specific application of the disclosed techniques is given by the growing integration of HVDC grids into power grids worldwide. These systems can be naturally decomposed the system into AC and HVDC subsystems. Using the disclosed techniques, state estimates for each of the AC and HVDC systems can be obtained in a distributed, coordinated fashion. However, the techniques are not limited in their application to AC/HVDC systems. For instance, the disclosed techniques may also be applied to power systems that can be decomposed into one or more transmission subsystems and one or more distribution subsystems. More generally, the techniques may be applied to many different subdivisions of a power system, provided only that the state of each subsystem is over-determined by the measurements available for that subsystem, given the state of any boundaries between the subsystem and the one or more other subsystems being analyzed.

Traditionally, state estimation is executed on an entire system as a whole. In many cases, it is of interest to execute it separately on parts of the system, e.g., for administrative reasons. It is important that the process of state estimation through system decomposition is carefully designed such that it minimizes the mismatch at the boundaries of the system parts, obtains the solution in reasonable numerical efforts and time. The disclosed techniques achieve these requirements. The systems and processes disclosed herein are intended for use in the energy management system (EMS) of electrical power systems where the overall system is an interconnection of multiple subsystems, such as in the case of hybrid AC-DC grid systems where the DC grid is a meshed DC network connecting multiple converter stations.

According to several embodiments of the present invention, then, the state estimation problem for interconnected system is solved through a decomposition approach, such that:

the problem is decomposed into multiple smaller sub problems and solved independently;

a central coordination problem solves a overall but simplified master (combined) problem on coordination variables; and the above steps are iterated until convergence.

For convenience and clarity, the following discussion describes the application of the present techniques to a power system divided into two subsystems, without any loss of generality. It will be readily appreciated by those knowledgeable in the field of state estimation that the techniques can be extended to power systems divided into three or more subsystems. Furthermore, although the decomposition and composition approach described below is formulated for the problem of weight-least-squares (WLS) state estimation, the same approach is also applicable to other classes of optimization problems where the sensitivities of the sub problem solution can be calculated with respect to the decision variables in the master problem.

FIG. 1 is a simplified illustration of an example power system having ten interconnected, numbered nodes. For the purposes of the following detailed discussion, this should be understood as the entire power system of interest, although it will be understood that this is a simplified example and that the techniques described herein are extensible to much more extensive and complicated systems.

In general terms, the objective of state estimation is to determine the state vector that minimizes a defined distance metric between a vector of system measurements, i.e., a measurement vector, and a measurement function vector evaluated at the estimated state vector. Given a vector of measurements z, a state vector x, and a measurement function h(x) that relates the measurements to the state vector, i.e., according to z=h(x), then the common weighted-least-square (WLS) state estimation problem is thus defined as $$\underset{x}{\operatorname{Min}}(z - h(\hat{x}))^T W(z - h(\hat{x})), \quad (1)$$

where $\hat{x}$ is an estimate of the state vector x and W is a weighting matrix. More particularly:

$$W = R^{-1}, \quad (2)$$

where R is the covariance matrix of the measurement errors associated with measurement vector z. Commonly, R is constrained to be a diagonal matrix of the individual measurement variances, i.e., $$R = \operatorname{diag}[\sigma_1^2 \sigma_2^2 \sigma_3^2 \ldots \sigma_m^2], \quad (3)$$

where m is the number of measurements in z.

In a power system, the state vector x commonly can be represented as $$x = (V, \delta),$$

where V is a vector of bus voltage phasor magnitudes and $\delta$ is a corresponding vector of bus voltage phasor angles. However, it will be appreciated that the state vector may comprise other state variables, as well.

Common measurements that make up the measurement vector z include nodal measurements, such as bus voltage, phase angle, real and reactive power injections, etc. Other common measurements include branch measurements, such as branch power flow, current magnitude, and the like.

The first-order optimality condition of the WLS state estimation problem is:

$$H^T(\hat{x}) W(z - h(\hat{x})) = 0, \qquad (4)$$

where $$H^T(\hat{x}) = \frac{\partial h(\hat{x})}{\partial \hat{x}}$$

is the Jacobian matrix of the measurement functions with respect to the state variables, evaluated at the state estimate $\hat{X}$.

The optimality condition is commonly solved iteratively with the following iteration equations:

$$\hat{x}^{k+1} = \hat{x}_k + \Delta k_5, \qquad (5)$$

and $$(H^T(\hat{x}^k) W H(\hat{x}^k)) \Delta \hat{x}^k = H^T(\hat{x}k) W(z - h(\hat{x}^k)). \qquad (6)$$

Figure 2:
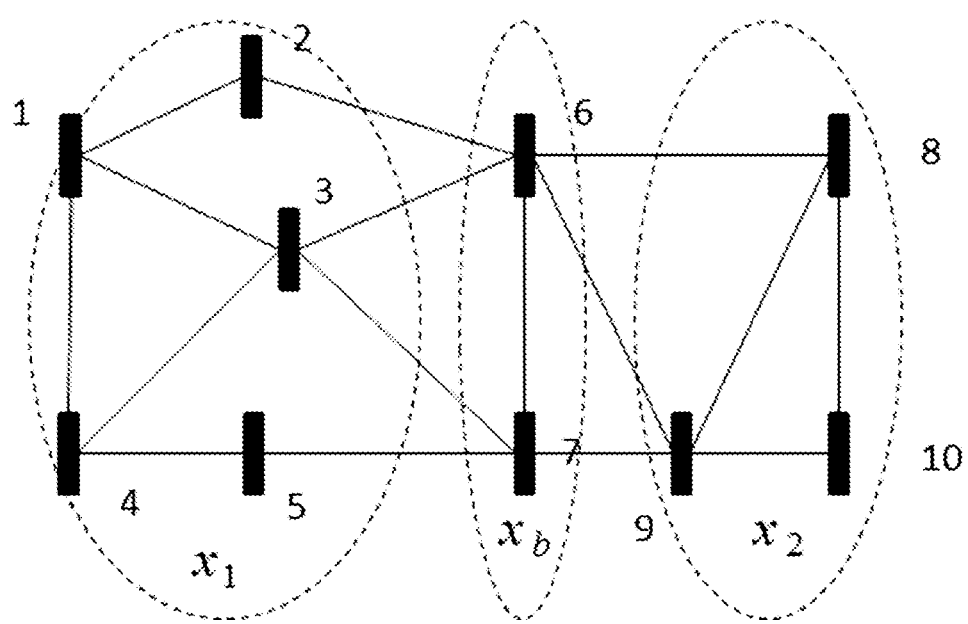
FIG. 2 illustrates the same power system after partitioning into first and second subsystems, with a shared boundary.

FIG. 2 illustrates the partitioning of the system shown in FIG. 1 into two subsystems, with a shared boundary. The first subsystem includes nodes 1-5, and has a state vector $x_1$. The second subsystem includes nodes 8, 9, and 10, and has a state vector $x_2$. The two subsystems have a shared boundary, which in the illustrated example includes nodes 6 and 7 and which has a state vector $x_b$. Typically:

$$x_1 = (V_1, \delta_1);$$

$$x_2 = (V_2, \delta_2); \text{ and}$$

$$x_b = (V_b, \delta_b).$$

Figure 4:
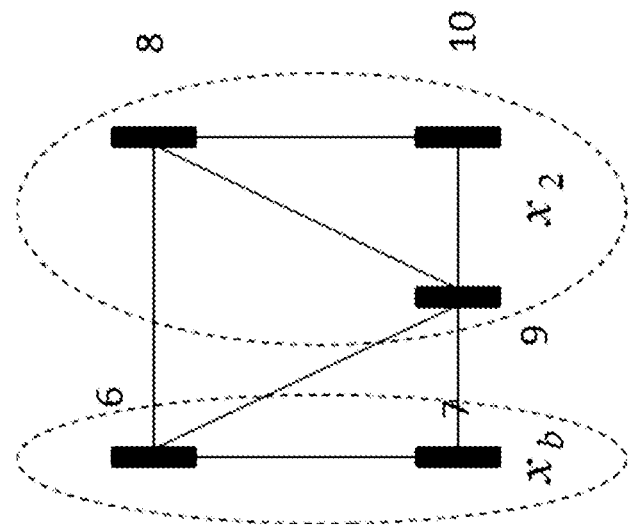
FIGS. 3 and 4 illustrate the separate measurement transfer responses for the first and second subsystems, respectively.
Figure 3:
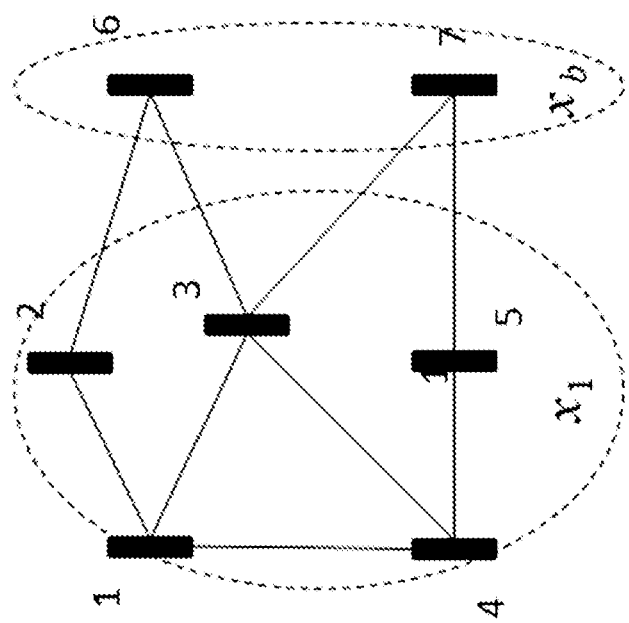
Figure 5:
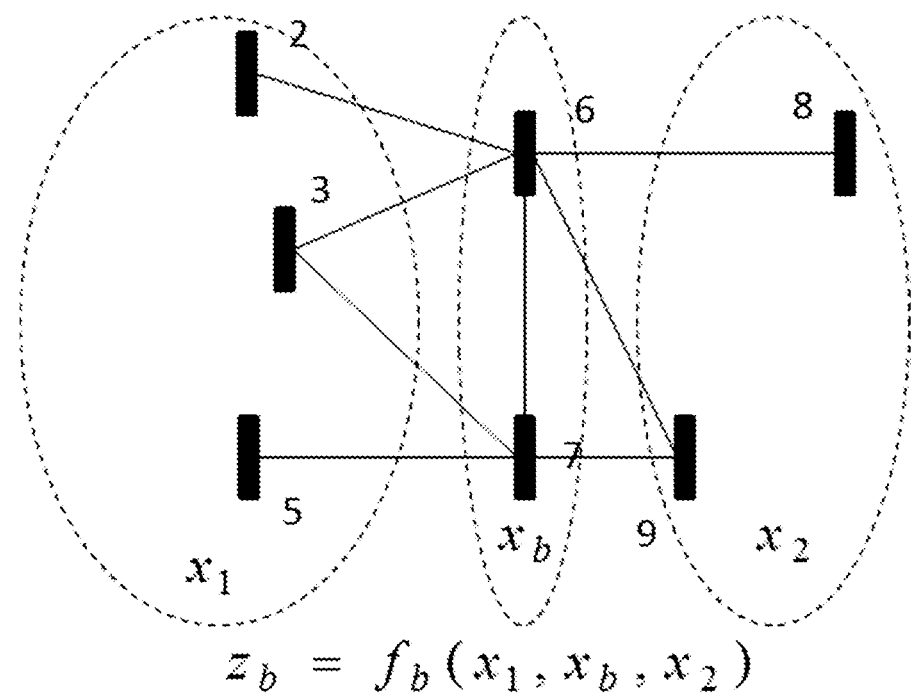
FIG. 5 illustrates the relationship between the boundary state and the subsystem states.

Similarly, the measurements are divided into three groups, as shown in FIGS. 3, 4, and 5, where $z_1$ is the interior measurement vector of the first subsystem, $z_2$ is the interior measurements vector for the second subsystem, and $z_b$ is the boundary bus measurement vector. Likewise, each subsystem has a corresponding measurement function vector. Thus, $h_1(x_1, x_b)$ is the interior measurement function vector of the first subsystem, $h_2(x_2, x_b)$ is the interior measurement function vector of the second subsystem, while $h_b(x_1, x_2, x_b)$ is the boundary bus measurement vector.

As seen in FIG. 3, the measurement vector $z_1$ for the first subsystem is a function of only the state vectors $x_1$ and $x_b$, and is thus independent of the state vector $x_2$. Likewise, as seen in FIG. 4, the measurement vector $z_2$ for the second subsystem is a function of only the state vectors $x_2$ and $x_b$, and is thus independent of the state vector $x_1$. This means that the state of each subsystem can be evaluated separately and independently, given the state vector $x_b$. As seen in FIG. 5, a measurement vector $z_b$ for the boundary buses can be represented as a function of the state vectors $x_1$, $x_2$ and $x_b$, i.e., $z_b = f(x_1, x_b, x_2)$. This suggests, of course, that the boundary state vector cannot be estimated without taking account of both subsystem state vectors $x_1$ and $x_2$. As will be seen, however, an estimate of the boundary state vector can be iteratively updated, based on separately obtained estimates of the subsystem state $x_1$ and $x_2$. These iteratively obtained estimates of the boundary state vector can then be fed back to the separate subsystem state estimation processes, for subsequent iterations of the subsystem state estimations.

A mathematical justification for this approach begins with the formulation of the complete WLS state estimation problem for the system illustrated in FIGS. 1-5:

$$\min_{\hat{x}_1, \hat{x}_2, \hat{x}_b} (z_1 - h_1(\hat{x}_1, \hat{x}_b))^T W_1 (z_1 - h_1(\hat{x}_1, \hat{x}_b)) + \qquad (7)$$

$$(z_2 - h_2(\hat{x}_2, \hat{x}_b))^T W_2 (z_2 - h_2(\hat{x}_2, \hat{x}_b)) +$$

$$(z_b - h_b(\hat{x}_1, \hat{x}_2, \hat{x}_b))^T W_b (z_b - h_b(\hat{x}_1, \hat{x}_2, \hat{x}_b)).$$

Given the formulation shown in (7), two sub-problems can be defined, one for each of the subsystems. These problems may be referred to as problems P1 and P2, for the first and second subsystems, respectively. Only P1 is shown below; P2 can be obtained by changing the subscripts from "1" to "2".

$$P1: \min_{\hat{x}_1} (z_1 - h_1(\hat{x}_1, \hat{x}_b))^T W_1 (z_1 - h_1(\hat{x}_1, \hat{x}_b)). \qquad (8)$$

Before moving on, a Jacobian matrix for the system is defined, as follows:

$$\begin{bmatrix} \dfrac{\partial h_1}{\partial (\hat{x}_1, \hat{x}_b, \hat{x}_2)} \\ \dfrac{\partial h_b}{\partial (\hat{x}_1, \hat{x}_b, \hat{x}_z)} \\ \dfrac{\partial h_2}{\partial (\hat{x}_1, \hat{x}_b, \hat{x}_2)} \end{bmatrix} = \begin{bmatrix} H_{11} & H_{1b} & 0 \\ H_{b1} & H_{bb} & H_{b2} \\ 0 & H_{2b} & H_{22} \end{bmatrix}. \qquad (9)$$

Given that a boundary state estimate $\hat{x}_b$ is fixed at a specified value, the following problem can be solved for one iteration:

$$\min_{\Delta x_1} (\Delta z_1 - H_{11} \Delta x_1)^T W_1 (\Delta z_1 - H_{11} \Delta x_1), \qquad (10)$$

where $\Delta x_1$ represents an incremental update to the state estimate $\hat{x}_1$ and $\Delta z_1$ is evaluated at the current $\hat{x}_1$ and $\hat{x}_b$ according to $$\Delta z_1 = (z_1 - h_1(\hat{x}_1, \hat{x}_b)). \qquad (11)$$

The following equation is solved to get the state estimate correction $\Delta x_1$:

$$(H_{11}^T W_1 H_{11}) \Delta x_1 = H_{11}^T W_1 \Delta z_1. \qquad (12)$$

Then, the updated state estimate value is:

$$\hat{x}_1^{new} = \hat{x}_1 + \Delta x_1. \qquad (13)$$

Next, the sensitivity of $\hat{x}_1$ with respect to the boundary state estimate $\hat{x}_b$ can be calculated according to:

$$(H_{11}^T W_1 H_{11})\Delta x_1 = -H_{11}^T W_1 H_{1b}\Delta x_b, \quad (14)$$

$$\Delta x_1 = K_{1b}\Delta x_b, \quad (15)$$

and $$K_{1b} = -(H_{11}^T W_1 H_{11})^{-1} H_{11}^T W_1 H_{1b}. \quad (16)$$

A similar sub-problem to that defined above can be solved, independently, for subsystem state $x_2$. It will be appreciated that this means that the sub-problems can be (but are not necessarily) solved at different computing nodes, and measurement data for measurements internal to each subsystem need not be shared between the two nodes. Only the boundary state estimate $\hat{x}_b$ needs to be shared between the nodes, in this case. In some embodiments, the boundary state estimate $\hat{x}_b$ may be provided to the node or nodes computing the sub-system solutions by a coordinating node, which may be separate from both sub-system nodes, or which may be common to one of the sub-system nodes.

Once the sub-problem defined above for subsystem states $x_1$ and $x_2$ are solved, for one or more iterations, the sensitivity data, including $K_{1b}$, $K_{2b}$, $\Delta z_1$, and $\Delta z_2$, is provided to the coordinating node. Given a current solution $(\hat{x}_b, \hat{x}_1, \hat{x}_2)$, the original problem, which can be regarded as the "coordination problem," can be rewritten in an incremental form, as follows:

$$\operatorname*{Min}_{\Delta x_b}(\Delta z_1 - K_{1b}\Delta x_b)^T W_1(\Delta z_1 - K_{1b}\Delta x_b) + \quad (17)$$
$$(\Delta z_2 - K_{2b}\Delta x_b)^T W_2(\Delta z_2 - K_{2b}\Delta x_b) +$$
$$(\Delta z_b - K_{bb}\Delta x_b)^T W_b(\Delta z_b - K_{bb}\Delta x_b),$$

or, in more compact form, as:

$$\min_{\Delta x_b}\left(\begin{bmatrix}\Delta z_1\\ \Delta z_b\\ \Delta z_2\end{bmatrix} - \begin{bmatrix}K_{1b}\\ K_{bb}\\ K_{1b}\end{bmatrix}\Delta x_b\right)^T \begin{bmatrix}W_1 & & \\ & W_b & \\ & & W_2\end{bmatrix}\left(\begin{bmatrix}\Delta z_1\\ \Delta z_b\\ \Delta z_2\end{bmatrix} - \begin{bmatrix}K_{1b}\\ K_{bb}\\ K_{1b}\end{bmatrix}\Delta x_b\right), \quad (18)$$

where $$K_{bb} = H_{bb} + H_{b1}K_{1b} + H_{b2}K_{2b}. \quad (19)$$

Equation (18) can be solved, using the standard equation, to obtain an update the estimated boundary state vector:

$$\hat{x}_b^{new} = \hat{x}_b + \Delta x_b. \quad (20)$$

The updated estimate of the boundary state vector can then be provided to the node or nodes computing the sub-system solutions, for use in the next iteration of the sub-system state estimation calculations.

An optimal state estimate is found (and the iterative process terminated) when the composite state estimate $[(\hat{x}_b, \hat{x}_1, \hat{x}_2]$ satisfies the first order optimality condition:

$$|g| = |H^T(x)W(z - h(x))| \le \epsilon. \quad (21)$$

For the example system described above:

$$g = \begin{bmatrix}H_{11} & H_{1b} & 0\\ H_{b1} & H_{bb} & H_{b2}\\ 0 & H_{b2} & H_{22}\end{bmatrix}^T \begin{bmatrix}W_1 & & \\ & W_b & \\ & & W_2\end{bmatrix}\left(\begin{bmatrix}z_1\\ z_b\\ z_2\end{bmatrix} - \begin{bmatrix}h_1\\ h_b\\ h_2\end{bmatrix}\right). \quad (22)$$

Figure 6:
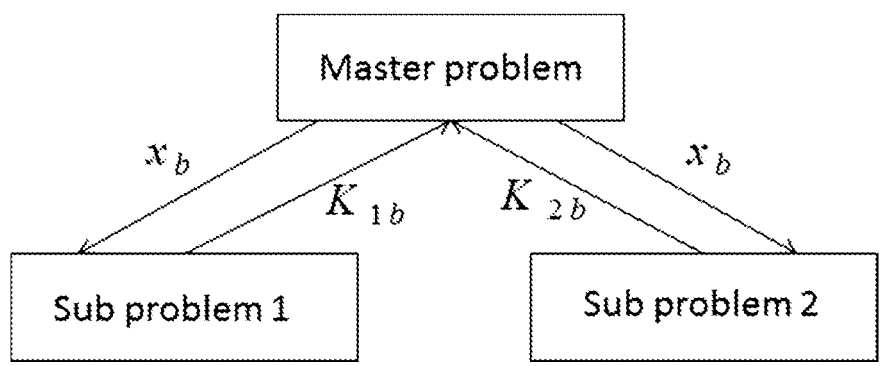
FIG. 6 illustrates the partitioning of the state estimation problem into a hierarchical problem, including a "master" problem and two "sub-problems."

It should be appreciated that the solution strategy described above can be viewed as a two level estimation (WLS optimization), where at a top (master) level, the decision variables are the boundary states, and at a lower (sub-problem level), the decision variables are the interior states of a subsystem with the boundary condition being held constant. This is illustrated in FIG. 6. It should also be appreciated that if there are no actual measurements available for the boundary bus, zero injection pseudo measurements can be added for the bus.

Figure 7:
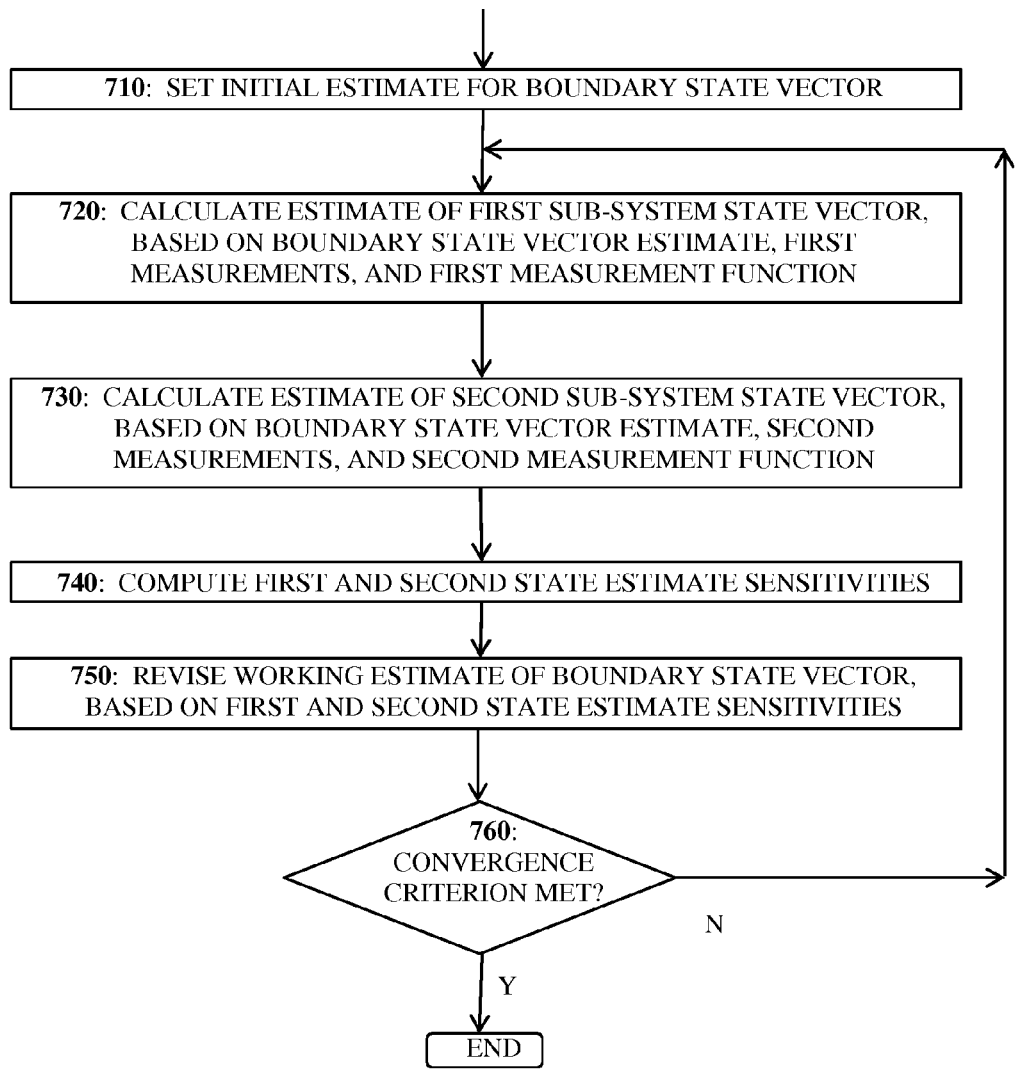
FIG. 7 is a process flow diagram illustrating an example method for power system state estimation.

With the above mathematical justification in mind, it will be appreciated that FIG. 7 illustrates a generalized method for state estimation according to the above-described techniques, for a power system that includes a first subsystem having a corresponding first state vector and corresponding first measurements for a first state estimation time, a second subsystem having a corresponding second state vector and corresponding second measurements for the first state estimation time, and a boundary connecting the first and sub-systems and having a boundary state vector for the first state estimation time. The method begins, as shown at block 710, with setting a working estimate of the boundary state vector to equal an initial estimate, for use in a first iteration of the technique. This initial estimate may be based on a state estimate for the system obtained for an earlier state estimation time, in some embodiments, but may be completely arbitrary in others.

Next, as shown at blocks 720-760, several steps are carried out for each of several iterations. As shown at block 720, an estimate of the first state vector is calculated, based on the working estimate of the boundary state vector, the first measurements, and a first subsystem measurement function. An estimate of the second state vector is separately calculated, as shown at block 730, based on the working estimate of the boundary state vector, the second measurements, and a second subsystem measurement function. Because these are separate and independent calculations, they can be carried out simultaneously, at separate nodes, although the technique may be carried out at a single node.

As was detailed above, calculating the estimates of the subsystem state vectors in some embodiments comprises formulating a first weighted least squares problem for estimating the first subsystem state vector, using a first covariance matrix of error statistics for the measurements taken for the first subsystem, and forming a second weight least squares problem for estimating the second subsystem state vector, using a second covariance matrix of error statistics for the measurements taken for the second subsystem. The first and second covariance matrices may be constrained to be diagonal matrices, in some embodiments.

In some embodiments, the first and second weighted least squares problems are formulated for solving with an iterative technique, in which case only a single iteration of the iterative technique needs to be carried out for each problem to obtain the estimates of the first and second state vectors for a given iteration of the overall problem. Of course, multiple iterations of the iterative solutions for the sub-problems may be carried out, in some embodiments.

Next, as shown at block 740, first and second state estimate sensitivities are computed, the first and second state estimate sensitivities representing sensitivities of the estimates of the first and second state vectors to the initial estimate of the boundary state vectors, respectively. Although illustrated in a single block in FIG. 6, it should be appreciated that the calculations of the first and second state estimate sensitivities are also separate and independent, and may be carried out in separate nodes, in some embodiments.

In some embodiments, as was detailed above, computing the state estimate sensitivity for each subsystem comprises computing a Jacobian matrix of the subsystem measurement function, with respect to the subsystem state vector and the boundary state vector, and calculating the state estimate sensitivity as a function of the Jacobian matrix and a covariance matrix of error statistics for the subsystem measurements.

Finally, as shown at block 750, the working estimate of the boundary state vector is revised, based on the first and second state estimate sensitivities. As detailed above, in some embodiments this comprises formulating a weighted least squares problem for estimating the boundary state vector, using a first covariance matrix of error statistics for the first measurements, a second covariance matrix of error statistics for the second measurements, and a third covariance matrix of error statistics for boundary measurements, if any, and solving for the revised working estimate of the boundary state vector.

In some embodiments, this operation is performed at a coordinating node, which may be separate from either or both of the nodes performing the subsystem calculations. This node may also perform a test of whether a convergence criterion is met, as shown at block 760. The calculating, computing, and revising operations of blocks 720-750 are repeated until this criterion is met. The convergence criterion may comprise a first-order optimality condition with respect to the first state estimate, the second state estimate, and the boundary state estimate, in some embodiments.

The techniques illustrated generally in FIG. 7 and detailed above are readily mapped to several different approaches for decomposing a power system into subsystems. In one example, the first subsystem in a two-subsystem decomposition is an AC portion of a hybrid AC-DC grid system, while the second subsystem is a HVDC portion of the hybrid AC-DC grid system. In another example, the first subsystem in a two-subsystem decomposition is a transmission portion of an electrical power grid and the second subsystem is a distribution portion of the electrical power grid. It will be appreciated that a power system may be decomposed into more than two subsystems, and the techniques described above extended to a multi-part solution of the state estimation problem.

Figure 8:
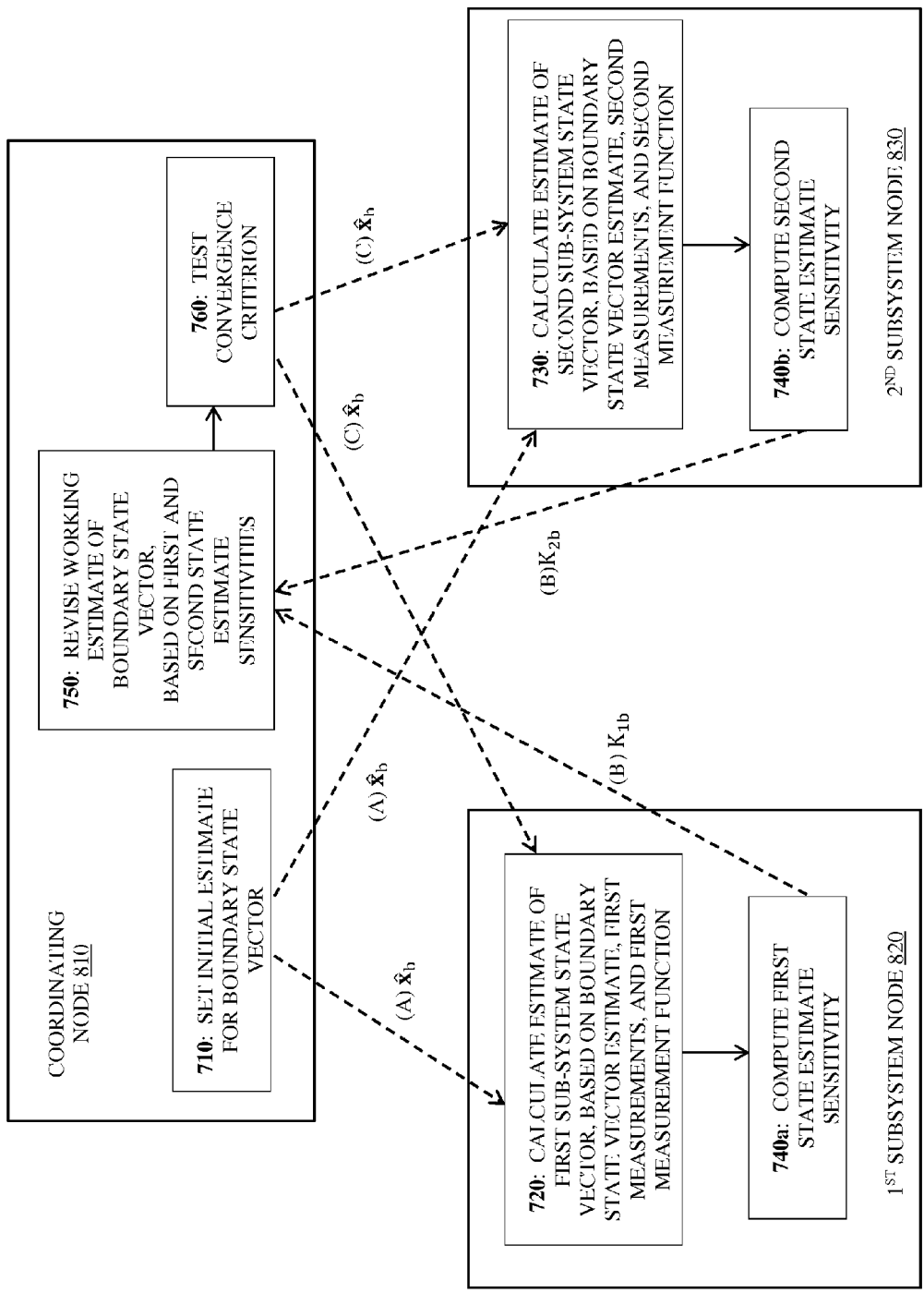
FIG. 8 illustrates an example mapping of the operations of FIG. 7 to processing nodes.

As suggested above, the technique illustrated in FIG. 7 may be carried out by one or several processing elements, or nodes. In some instances, these nodes may be operated by different entities, e.g., where one subsystem node and the coordinating node is operated by the operator of a distribution network and the other subsystem node is operated by the owner of an HVDC portion of a hybrid AC-DC grid system. FIG. 8 illustrates an example mapping of the operations shown in FIG. 7 to a coordinating node 810 and to each of two subsystem nodes 820 and 830. It will be appreciated that the coordinating node 810 may be the same as one or the other of the subsystem nodes 820 and 830, in some embodiments.

As seen in FIG. 8, the coordinating node 810 in this example is responsible for setting the initial estimate for the boundary state vector (block 710) and communicating this initial estimate $\hat{x}_b$ to the subsystem nodes, as shown at transfer step A. The subsystem nodes 820 and 830 each calculate an estimate (blocks 720 and 730) of their respective subsystem state vectors $\hat{x}_1$ and $\hat{x}_2$, based on the initial estimate for the boundary state vector and based on respective subsystem measurements. The subsystem nodes 820 and 830 then compute their respective state estimate sensitivities (blocks 740a and 740b), with respect to the boundary state estimate, and pass the computed sensitivity measures $K_{1b}$ and $K_{2b}$ back to the coordinating node 810, as shown at transfer step B. The coordinating node 810 then revises the working estimate of the boundary state vector (block 750), based on these sensitivity measures, and tests the estimates for convergence (block 760). If the solution has not converged, the revised estimate of the boundary state vector $\hat{x}_b$ is then passed back to the subsystem nodes 820 and 830 for another iteration of the process, as shown at transfer step C.

Figure 9:
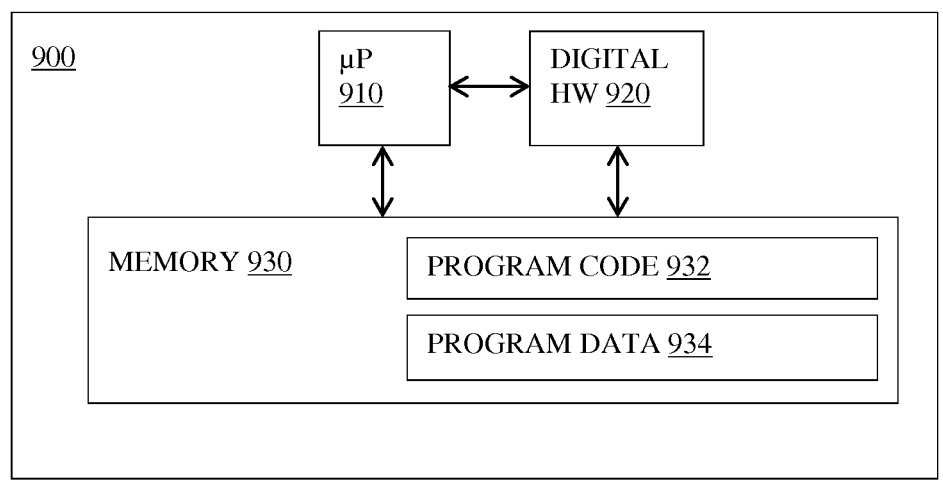
FIG. 9 illustrates an example processing circuit.

FIG. 9 is a block diagram illustrating an example configuration for a processing circuit 900, which may be present in any one or more of the processing nodes illustrated in FIG. 8. The pictured example includes one or more microprocessors or microcontrollers 910, as well as other digital hardware 920, which may include digital signal processors (DSPs), special-purpose digital logic, and the like. Either or both of microprocessor(s) 910 and digital hardware 920 may be configured to execute program code 932 stored in memory 930 along with program data 934. Again, because the various details and engineering tradeoffs associated with the design of processing circuits are well known and are unnecessary to a full understanding of the invention, additional details are not shown here.

The program code 932 stored in memory circuit 930, which may comprise one or several types of memory such as read-only memory (ROM), random-access memory, cache memory, flash memory devices, optical storage devices, etc., includes program instructions for carrying out all or parts of the power system state estimation techniques described above, in several embodiments. The program data 934 include various pre-determined system configuration parameters, as well as parameters and estimates determined during the state estimation process.

As discussed above, the operations described in FIG. 7 can be mapped to one or several processing elements, like processing circuit 900, in any of several different ways. Thus, in some embodiments, a state estimation unit for use in estimating the state of a power system that comprises at least one processing circuit 900, where the at least one processing circuit 900 is configured to, for a first iteration, set a working estimate of the boundary state vector to equal an initial estimate, and, for the first iteration and for one or more subsequent iterations: calculate an estimate of the first state vector, based on the working estimate of the boundary state vector, the first measurements, and a first subsystem measurement function, and separately calculate an estimate of the second state vector, based on the working estimate of the boundary state vector, the second measurements, and a second subsystem measurement function; compute first and second state estimate sensitivities, the first and second state estimate sensitivities representing sensitivities of the estimates of the first and second state vectors to the initial estimate of the boundary state vectors, respectively; and revise the working estimate of the boundary state vector, based on the first and second state estimate sensitivities. The at least one processing circuit 900 is further configured to repeat the calculating, computing, and revising operations until a convergence criterion is met. The state estimation unit further comprises at least one memory configured to store the estimates of the first and second state vectors, the working estimate of the boundary state vector, and the first and second state estimate sensitivities; in some embodiments this may be the same memory or memories used to store the program code for use by the at least one processing circuit 900.

In some embodiments, the at least one processing circuit comprises a first subsystem processor configured to, for each iteration: receive the working estimate of the boundary state vector from a master processor; calculate the estimate of the first state vector; compute the first state estimate sensitivity; and send the estimate of the first state vector and the first state estimate sensitivity to the master processor. In some of these embodiments, the at least one processing circuit further comprises the master processor, and the master processor is configured to, for each iteration: send the working estimate of the boundary state vector to the first subsystem processor; receive the estimate of the first state vector and the first state estimate sensitivity from the first subsystem processor; and revise the revise the working estimate of the boundary state vector.

In some of these embodiments, the master processor is further configured to: send the working estimate of the boundary state vector to a second subsystem processor; and receive the estimate of the second state vector and the second state estimate sensitivity from the first subsystem processor. It will be appreciated that these latter embodiments resemble the system configuration illustrated in FIG. 8.

The processing circuit 900 shown in FIG. 9 may be configured, e.g., with appropriate program code, to carry out any of the variations of the state estimation techniques described above. Thus, for example, in some embodiments the processing circuit 900 is configured to calculate the estimate of the first state vector by formulating a first weighted least squares problem for estimating the first state vector, using a first covariance matrix of error statistics for the first measurements, and forming a second weight least squares problem for estimating the second state vector, using a second covariance matrix of error statistics for the second measurements. The processing circuit 900 may be configured to formulate the first and second weighted least squares problems for solving with an iterative technique, in some embodiments, and to perform only a single iteration of the iterative technique for each problem to obtain the estimates of the first and second state vectors. The processing circuit may be configured to compute the first state estimate sensitivity by computing a Jacobian matrix of the first subsystem measurement function, with respect to the first state vector and the boundary state vector, and calculating the first state estimate sensitivity as a function of the Jacobian matrix and a covariance matrix of error statistics for the first measurements.

In some embodiments, processing circuit 900 is configured to revise the working estimate of the boundary state vector by formulating a weighted least squares problem for estimating the boundary state vector, using a first covariance matrix of error statistics for the first measurements, a second covariance matrix of error statistics for the second measurements, and a third covariance matrix of error statistics for boundary measurements, if any, and solving for the revised working estimate of the boundary state vector. Note that the processing circuit 900 performing this operation may be different from the processing circuit (or circuits) used to perform the subsystem state estimation operations, in some embodiments. In any case, in some embodiments the convergence criterion comprises a first-order optimality condition with respect to the first state estimate, the second state estimate, and the boundary state estimate.

A key advantage of the techniques and apparatus described above is that they facilitate the separate execution of state estimation for various parts of a power grid system, in a coordinated way. Administrative or practical constraints may require that different parts of the system be addressed separately, while allowing some coordination among them. A leading example is provided by integrated AC and HVDC grid systems.

In the preceding discussion and in the appended claims, terms such as "first", "second", and the like, are used to describe various elements, regions, sections, etc. and are not intended to be limiting. Like terms refer to like elements throughout the description. As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for state estimation in a power system that comprises a first subsystem having a corresponding first state vector and corresponding first measurements for a first state estimation time, a second subsystem having a corresponding second state vector and corresponding second measurements for the first state estimation time, and a boundary connecting the first and subsystems and having a boundary state vector for the first state estimation time, the method. comprising:

operating a first plurality of sensors structured to measure the first measurements of the first subsystem of the power system and a second plurality of sensors structured to measure the second measurements of the second subsystem of the power system;

operating a first microprocessor-based state estimation unit configured to receive the first measurements from the first plurality of sensors but not able to receive the second measurements from the second plurality of sensors and a second microprocessor-based state estimation unit configured to receive the second measurements from the second plurality of sensors but not able to receive the first measurements from the first plurality of sensors;

operating a third microprocessor-based state estimation unit configured to communicate with the first microprocessor-based state estimation unit and the second microprocessor-based state estimation unit;

for a first iteration, setting a working estimate of the boundary state vector to equal an initial estimate with the third state estimation unit;

for the first iteration and for one or more subsequent iterations, calculating, with the first state estimation unit, an estimate of the first state vector, based on the working estimate of the boundary state vector, the first measurements, and a first subsystem measurement function, and separately calculating, with the second state estimation unit, an estimate of the second state vector, based on the working estimate of the boundary state vector, the second measurements, and a second subsystem measurement function;

for the first iteration and for one or more subsequent iterations, computing, with the first state estimation unit, a first state estimate sensitivity and computing, with the second state estimation unit, a second state estimate sensitivity, the first and second state estimate sensitivities representing sensitivities of the estimates of the first and second state vectors to the initial estimate of the boundary state vectors, respectively;

revising, with the third state estimation unit, the working estimate of the boundary state vector, based on the first and second state estimate sensitivities; and repeating, with the first state estimation unit, the second state estimation unit, and the third first state estimation unit the calculating, computing, and revising operations until a convergence criterion is met.

2. The method of claim 1, wherein the initial estimate for the boundary state vector is a final estimate for the boundary state vector from a previous state estimation time.

3. The method of claim 1, wherein calculating the estimate of the first state vector comprises formulating a first weighted least squares problem for estimating the first state vector, using a first covariance matrix of error statistics for the first measurements, and forming a second weight least squares problem for estimating the second state vector, using a second covariance matrix of error statistics for the second measurements.

4. The method of claim 3, wherein the first and second weighted least squares problems are formulated for solving with an iterative technique, the method further comprising performing only a single iteration of the iterative technique for each problem to obtain the estimates of the first and second state vectors.

5. The method of claim 3, wherein the first and second covariance matrices are diagonal matrices.

6. The method of claim 1, wherein computing the first state estimate sensitivity comprises computing a Jacobian matrix of the first subsystem measurement function, with respect to the first state vector and the boundary state vector, and calculating the first state estimate sensitivity as a function of the Jacobian matrix and a covariance matrix of error statistics for the first measurements.

7. The method of claim 1, wherein revising the working estimate of the boundary state vector comprises formulating a weighted least squares problem for estimating the boundary state vector, using a first covariance matrix of error statistics for the first measurements, a second covariance matrix of error statistics for the second measurements, and a third covariance matrix of error statistics for boundary measurements, if any, and solving for the revised working estimate of the boundary state vector.

8. The method of claim 1, wherein the convergence criterion comprises a first-order optimality condition with respect to the first state estimate, the second state estimate, and the boundary state estimate.

9. The method of claim 1, wherein the first subsystem is an AC portion of a hybrid AC-DC grid system and the second subsystem is a HVDC portion of the hybrid AC-DC grid system.

10. The method of claim 1, wherein the first subsystem is a transmission portion of an electrical power grid and the second subsystem is a distribution portion of the electrical power grid.

11. A power system comprising:
a first subsystem having a corresponding first state vector and corresponding first measurements for a first state estimation time;
a second subsystem having a corresponding second state vector and corresponding second measurements for the first state estimation time;
a subsystem boundary connecting the first and second subsystems and having a boundary state vector for the first state estimation time;

a combination including a first microprocessor-based state estimation unit in operative communication with a first plurality of sensors of the first subsystem but not the second plurality of sensors of the second subsystem, a second microprocessor-based state estimation unit in operative communication with a second plurality of sensors of the second subsystem but not the first plurality sensors of the first subsystem, and a third microprocessor-based state estimation unit in operative communication with the first microprocessor-based state estimation unit and the second microprocessor-based state estimation unit configured to:

for a first iteration, set with the third microprocessor-based state estimation unit a working estimate of the boundary state vector to equal an initial estimate;

for the first iteration and for one or more subsequent iterations, calculate with the first microprocessor-based state estimation unit an estimate of the first state vector, based on the working estimate of the boundary state vector, the first measurements, and a first subsystem measurement function, and separately calculate with the second microprocessor-based state estimation unit an estimate of the second state vector, based on the working estimate of the boundary state vector the second measurements, and a second subsystem measurement function;

for the first iteration and for one or more subsequent iterations, compute a first state estimate sensitivity with the first microprocessor-based state estimation unit and compute a second state estimate sensitivities with the second microprocessor-based state estimation unit, the first and second state estimate sensitivities representing sensitivities of the estimates of the first and second state vectors to the initial estimate of the boundary state vectors, respectively;

revise the working estimate of the boundary state vector with the third microprocessor-based state estimation unit, based on the first and second state estimate sensitivities; and repeat the calculating, computing, and revising operations until a convergence criterion is met; wherein each of the first microprocessor-based state estimation unit, the second microprocessor-based state estimation unit, and the third microprocessor-based state estimation unit includes at least one respective memory configured to store the estimates of respective ones of the first and second state vectors, the working estimate of the boundary state vector, and the first and second state estimate sensitivities.

12. The state estimation unit of claim 11, wherein the at least one processing circuit comprises a first subsystem processor configured to, for each iteration:
receive the working estimate of the boundary state vector from a master processor; calculate the estimate of the first state vector;
compute the first state estimate sensitivity; and
send the estimate of the first state vector and the first state estimate sensitivity to the master processor.

13. The state estimation unit of claim 12, wherein the at least one processing circuit further comprises the master processor, and wherein the master processor is configured to, for each iteration:
send the working estimate of the boundary state vector to the first subsystem processor;
receive the estimate of the first state vector and the first state estimate sensitivity from the first subsystem processor; and revise the revise the working estimate of the boundary state vector.

14. The state estimation unit of claim 13, wherein master processor is further configured to:
    send the working estimate of the boundary state vector to a second subsystem processor; and
    receive the estimate of the second state vector and the second state estimate sensitivity from the first subsystem processor.

15. The state estimation unit of claim 11, wherein the at least one processing circuit is configured to calculate the estimate of the first state vector by formulating a first weighted least squares problem for estimating the first state vector, using a first covariance matrix of error statistics for the first measurements, and forming a second weight least squares problem for estimating the second state vector, using a second covariance matrix of error statistics for the second measurements.

16. The state estimation unit of claim 15, wherein the at least one processing circuit is configured to formulate the first and second weighted least squares problems for solving with an iterative technique, and to perform only a single iteration of the iterative technique for each problem to obtain the estimates of the first and second state vectors.

17. The state estimation unit of claim 11, wherein the at least one processing circuit is configured to compute the first state estimate sensitivity by computing a Jacobian matrix of the first subsystem measurement function, with respect to the first state vector and the boundary state vector, and calculating the first state estimate sensitivity as a function of the Jacobian matrix and a covariance matrix of error statistics for the first measurements.

18. The state estimation unit of claim 11, wherein the at least one processing circuit is configured to revise the working estimate of the boundary state vector by formulating a weighted least squares problem for estimating the boundary state vector, using a first covariance matrix of error statistics for the first measurements, a second covariance matrix of error statistics for the second measurements, and a third covariance matrix of error statistics for boundary measurements, if any, and solving for the revised working estimate of the boundary state vector.

19. The state estimation unit of claim 11, wherein the convergence criterion comprises a first-order optimality condition with respect to the first state estimate, the second state estimate, and the boundary state estimate.

* * * * *